United States Patent
Na et al.

(10) Patent No.: US 10,497,670 B2
(45) Date of Patent: Dec. 3, 2019

(54) MULTI-CHIP PACKAGE CAPABLE OF TESTING INTERNAL SIGNAL LINES

(71) Applicant: Samsung Electronics Co., Ltd., Suwon-si, Gyeonggi-do (KR)

(72) Inventors: Dae-hoon Na, Seoul (KR); Hyun-jin Kim, Hwaseong-si (KR); Jang-woo Lee, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 15/656,071

(22) Filed: Jul. 21, 2017

(65) Prior Publication Data
US 2018/0158799 A1 Jun. 7, 2018

(30) Foreign Application Priority Data
Dec. 6, 2016 (KR) .................. 10-2016-0165176

(51) Int. Cl.
| | |
|---|---|
| *H01L 25/065* | (2006.01) |
| *G11C 16/26* | (2006.01) |
| *G11C 16/22* | (2006.01) |
| *G11C 16/10* | (2006.01) |
| *G11C 5/02* | (2006.01) |

(Continued)

(52) U.S. Cl.
CPC ...... *H01L 25/0652* (2013.01); *G01R 31/2803* (2013.01); *G11C 5/025* (2013.01); *G11C 16/10* (2013.01); *G11C 16/22* (2013.01); *G11C 16/26* (2013.01); *G11C 29/025* (2013.01); *H01L 22/34* (2013.01); *H01L 2224/48091* (2013.01); *H01L 2224/48137* (2013.01); *H01L 2224/48145* (2013.01); *H01L 2224/48227* (2013.01); *H01L 2225/06506* (2013.01); *H01L 2225/06596* (2013.01); *H01L 2924/181* (2013.01)

(58) Field of Classification Search
CPC .... H01L 25/06; H01L 25/065; H01L 25/0652
See application file for complete search history.

(56) References Cited

U.S. PATENT DOCUMENTS

| | | | |
|---|---|---|---|
| 7,679,133 | B2 | 3/2010 | Son et al. |
| 7,928,435 | B2 | 4/2011 | Park et al. |

(Continued)

FOREIGN PATENT DOCUMENTS

| | | |
|---|---|---|
| JP | 2001165987 A | 6/2001 |
| JP | 2004205352 A | 7/2004 |

(Continued)

*Primary Examiner* — Fazli Erdem
(74) *Attorney, Agent, or Firm* — Harness, Dickey & Pierce, P.L.C.

(57) ABSTRACT

A multi-chip package capable of testing internal signal lines including a printed circuit board, a first semiconductor chip mounted on the printed circuit board and including a test circuit, and second semiconductor chips mounted on the printed circuit board and electrically connected to the first semiconductor chip via a plurality of internal signal lines may be provided. The test circuit may be configured to enable circuits of the first semiconductor chip connected to pads contacting the plurality of internal signal lines, transmit complementary data to at least two pads from among the pads, and form a current path in the circuits connected to the at least two pads, thereby detecting a short-circuit between the internal bonding wires.

20 Claims, 13 Drawing Sheets

(51) Int. Cl.
    *G11C 29/02*    (2006.01)
    *G01R 31/28*    (2006.01)
    *H01L 21/66*    (2006.01)

(56) References Cited

U.S. PATENT DOCUMENTS

| | | |
|---|---|---|
| 8,488,381 B2 | 7/2013 | Kim et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,082,333 B2 | 7/2015 | Hwang et al. |
| 9,263,157 B2 | 2/2016 | Kilmer et al. |
| 2004/0262747 A1* | 12/2004 | Kiritani .............. G01R 31/2818 257/723 |
| 2011/0093224 A1* | 4/2011 | Ide .......................... G11C 29/02 702/64 |
| 2011/0233648 A1 | 9/2011 | Seol et al. |
| 2012/0056178 A1* | 3/2012 | Han ....................... H01L 22/32 257/48 |
| 2014/0334232 A1 | 11/2014 | Nam et al. |
| 2016/0049382 A1* | 2/2016 | Jeong ..................... H01L 24/85 438/10 |
| 2016/0327602 A1* | 11/2016 | Subramanian ....... G01R 31/045 |

FOREIGN PATENT DOCUMENTS

| | | |
|---|---|---|
| JP | 2006226908 A | 8/2006 |
| JP | 2009288040 A | 12/2009 |
| JP | 2011075334 A | 4/2011 |

\* cited by examiner

MULTI-CHIP PACKAGE CAPABLE OF TESTING INTERNAL SIGNAL LINES

CROSS-REFERENCE TO RELATED APPLICATION

This application claims priority under 35 U.S.C. § 119 to Korean Patent Application No. 10-2016-0165176 filed on Dec. 6, 2016, in the Korean Intellectual Property Office, the disclosure of which is incorporated herein in its entirety by reference.

BACKGROUND

The inventive concepts relate to semiconductor devices, and more particularly, to multi-chip packages including a test circuit for detecting failure of internal signal lines between semiconductor chips mounted therein.

As electronic devices include a plurality of semiconductor integrated circuits (or semiconductor chips), their hardware configurations have become more and more complicated. According to demands for miniaturization and weight reduction of electronic devices, in order to reduce the number of mounted components in the electronic devices, a multi-chip package including a plurality of semiconductor chips mounted in one package has been developed.

Semiconductor chips mounted in a multi-chip package are electrically connected to one another through internal signal lines (e.g., bonding wires). Some of the internal signal lines may be connected to an external terminal of the multi-chip package, and thus, failure of the internal signal lines may be detected by applying a signal to the external terminal. Some of the internal signal lines electrically interconnect semiconductor chips to one another inside the multi-chip package, and may not be connected to the external terminal of the multi-chip package. A method of testing for a defect of internal signal lines not connected to an external terminal in a multi-chip package is desired.

SUMMARY

Some of the inventive concepts provide multi-chip packages including a test circuit for detecting failure of internal signal lines between semiconductor chips mounted therein.

According to an aspect of the inventive concepts, a multi-chip package may include a printed circuit board, a first semiconductor chip on the printed circuit board and including a test circuit, and second semiconductor chips on the printed circuit board and electrically connected to the first semiconductor chip via a plurality of internal signal lines. The test circuit may be configured to enable circuits of the first semiconductor chip connected to pads contacting the plurality of internal signal lines, transmit complementary data to at least two pads from among the pads, and form a current path in the circuits connected to the at least two pads, thereby detecting a short-circuit of the internal bonding wires.

According to another aspect of the inventive concepts, a multi-chip package may include a printed circuit board, a first semiconductor chip on the printed circuit board and including a test circuit, and second semiconductor chips on the printed circuit board and electrically connected to the first semiconductor chip via a plurality of internal signal lines. The test circuit may be configured to enable first and second circuits of the first semiconductor chip respectively connected to first and second pads contacting the internal signal lines of the multi-chip package, output first data to the first pad through the first circuit, receive second data from the second pad through the second circuit, and invert one of the first and second data, thereby detecting a short-circuit of the internal signal lines.

According to an aspect of the inventive concepts, a multi-chip package may include a printed circuit board, a first semiconductor chip on the printed circuit board, the first semiconductor chip including a test circuit, a plurality of pads, an input driver, and an output driver, the test circuit including a write path selection circuit configured to provide first data to a first pad, from among the plurality of pads, via the output driver, a read path selection circuit configured to receive second data from a second pad, from among the plurality of pads, via the input driver, a data inversion circuit configured to invert one of the first and second data, a first switch configured to provide the first data of the write path selection circuit to the data inversion circuit, and a second switch configured to provide the second data of the read path selection circuit to the data inversion circuit, and second semiconductor chips on the printed circuit board, the second semiconductor chips electrically connected to the first and second pads of the first semiconductor chip via a plurality of internal signal lines

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
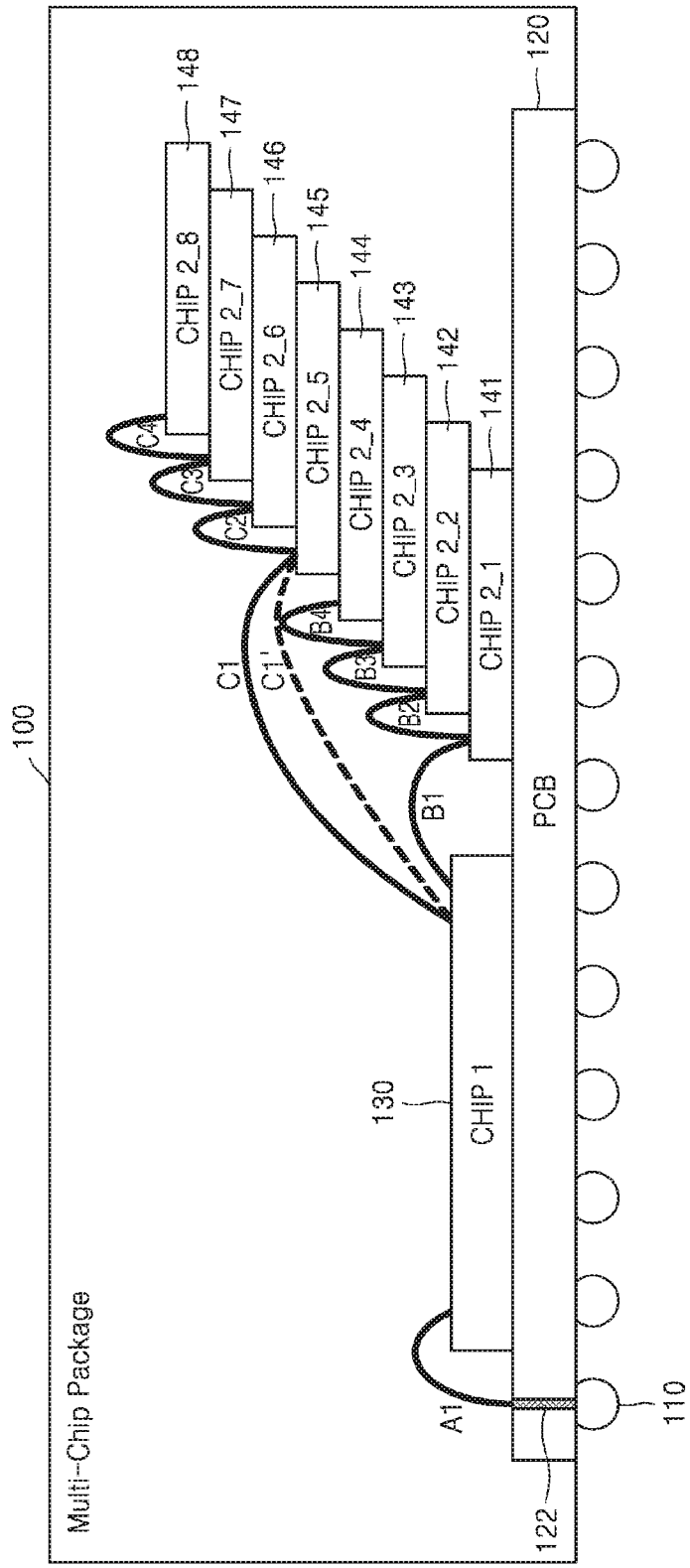
FIG. 1 is a cross-sectional view of a multi-chip package according to an example embodiment of the inventive concepts.

FIG. 1 is a cross-sectional view of a multi-chip package according to an example embodiment of the inventive concepts.

Referring to FIG. 1, a multi-chip package 100 may include a first semiconductor chip 130 and second semiconductor chips 141 through 148 that are mounted on a printed circuit board 120. The printed circuit board 120 may include a plurality of conductive layers (not shown) and through-silicon vias (TSVs) 122 that are separated from each other by an insulation layer. The conductive layers (not shown) and TSVs 122 of the printed circuit board 120 may be connected to external terminals 110 of the multi-chip package 100. For example, the external terminals 110 of the multi-chip package 100 may include package balls or leads.

The multi-chip package 100 may be, for example, a package on package (PoP), a ball grid array (BGA), a chip scale package (CSP), a plastic leaded chip carrier (PLCC) a plastic dual in-line package (PDIP), die in waffle pack, die in wafer form, chip on board (COB), ceramic dual in-line package (CERDIP), metric quad flat package (MQFP), thin quad flat pack (TQFP) SOIC), small outline (SOIC), shrink small outline package (SSOP), thin small outline (TSOP), system in package (SIP), or multi-chip package (MCP), wafer-level fabricated package (WFP).

The multi-chip package 100 may be a memory system with high capacity and high speed functionalities. For example, the multi-chip package 100 may be an embedded multimedia card (eMMC) device or a universal flash storage (UFS) device that includes NAND flash-based non-volatile memory devices and a memory controller for controlling the non-volatile memory devices. The second semiconductor chips 141 through 148 may include NAND flash memories. The first semiconductor chip 130 may be a memory controller that controls the second semiconductor chips 141 through 148.

The first semiconductor chip 130 may be electrically connected to the external terminal 110 of the multi-chip package 100 through a first bonding wire A1. The first bonding wire A1 may be connected between a pad of the TSV 122 of the printed circuit board 120 connected to the external terminal 110 and a pad of the first semiconductor chip 130. According to an example embodiment, the first bonding wire A1 may be connected between a pad, to which the conductive layer of the printed circuit board 120 connected to the external terminal 110 is connected, and the pad of the first semiconductor chip 130.

The second semiconductor chips 141 through 148 may include a plurality of non-volatile memory devices. The non-volatile memory device may include non-volatile memory devices (e.g., NAND flash memories, NOR flash memories, phase change memories (PRAM), resistive memories (ReRAM), or magnetic resistive memories (MRAM)). Hereinafter, it is assumed that a non-volatile memory device described herein is a NAND flash memory.

A non-volatile memory device includes a memory cell array having memory cells arranged in rows (word lines) and columns (bit lines). Each memory cell may store 1-bit (single bit) data or M-bit (multi-bit) data (where M is 2 or greater). Each memory cell may be implemented as a memory cell having a charge storage layer (e.g., a floating gate or a charge trapping layer), or a memory cell having a variable resistive element.

The memory cell array may have a single-layer array structure (or a two-dimensional (2D) array structure) or a multi-layer array structure (or a three-dimensional (3D) array structure). A 3D memory array may be monolithically formed on a substrate (e.g., semiconductor substrate such as silicon, or semiconductor-on-insulator substrate). The 3D memory array may include at least one physical level of memory cell arrays including an active area disposed on a silicon substrate, and a circuit associated with operation of the memory cells and disposed on or in the silicon substrate. The term "monolithic" means that a layer of each of levels that constitute the array is stacked directly on top of a layer of a lower level of the array.

According to an example embodiment, the 3D memory array includes NAND strings arranged in a vertical direction such that at least one memory cell is located above another memory cell. The at least one memory cell may include a charge trapping layer. U.S. Pat. Nos. 7,679,133, 8,553,466, 8,654,587, 8,559,235, and U.S. Patent Application Publication No. 2011/0233648, which disclose configurations of a 3D memory array including a plurality of levels and word lines and/or bit lines shared between levels, are incorporated herein by reference. Furthermore, U.S. Patent Application Publication No. 2014-0334232 and U.S. Pat. No. 8,488,381 are also incorporated herein by reference.

The non-volatile memory devices of the second semiconductor chips 141 through 148 may constitute one channel controlled by the first semiconductor chip 130, which is a memory controller. According to an example embodiment, a group from among the non-volatile memory devices operating independently from another group from among the non-volatile memory devices may configure individual channels, respectively. For example, the second semiconductor chips 141 through 144 may constitute a first channel and the second semiconductor chips 145 through 148 may constitute a second channel.

The second semiconductor chips 141 through 144 may be connected to the first semiconductor chip 130, which is a memory controller, through second bonding wires B1 through B4. The second bonding wires B1 through B4 may transmit commands, addresses, and/or data provided by the first semiconductor chip 130 to the second semiconductor chips 141 through 144. The second bonding wires B1 through B4 may constitute a signal line of one channel.

For example, the second bonding wire 131 may be connected between the first semiconductor chip 130 and the second semiconductor chip 141, the second bonding wire B2 may be connected between the second semiconductor chip 141 and the second semiconductor chip 142, the second bonding wire 133 may be connected between the second semiconductor chip 142 and the second semiconductor chip 143, and the second bonding wire B4 may be connected between the second semiconductor chip 143 and the second semiconductor chip 144.

The second semiconductor chips 145 through 148 may be connected to the first semiconductor chip 130, which is a memory controller, through third bonding wires C1 through C4. The third bonding wires C1 through C4 may transmit commands, addresses, and/or data provided by the first semiconductor chip 130 to the second semiconductor chips 145 through 148. Third bonding wires C1 through C4 may constitute a signal line of another channel.

For example, the third bonding wire C1 may be connected between the first semiconductor chip 130 and the second semiconductor chip 145, the third bonding wire C2 may be connected between the second semiconductor chip 145 and the second semiconductor chip 146, the third bonding wire C3 may be connected between the second semiconductor chip 146 and the second semiconductor chip 147, and the third bonding wire C4 may be connected between the second semiconductor chip 147 and the second semiconductor chip 148.

The second bonding wires B1 through B4 and third bonding wires C1 through C4 constitute internal signal lines of the multi-chip package 100. The second bonding wires B1 through B4 and the third bonding wires C1 through C4 are not connected to the external terminals 110 of the multi-chip package 100. The second bonding wires B1 through B4 and the third bonding wires C1 through C4 may be short-circuited to one another after the multi-chip package 100 is assembled.

For example, the physical length of the third bonding wire C1 in the multi-chip package 100 is longer than those of the other bonding wires A1, B1 through B4, and C2 through C4. If the third bonding wire C1 is sagged and become like a third bonding wire C1', the sagged third bonding wire C' may be short-circuited to the second bonding wire B4.

When the multi-chip package 100 in which the second bonding wire B4 and the third bonding wire C1' are short-circuited is mounted on an electronic device, the electronic device may not properly. Therefore, some example embodiments of the inventive concepts provide multi-chip packages capable of detecting a defective multi-chip package by testing whether bonding wires of the multi-chip package 100 (e.g., the internal signal lines) are short-circuited.

Figure 2:
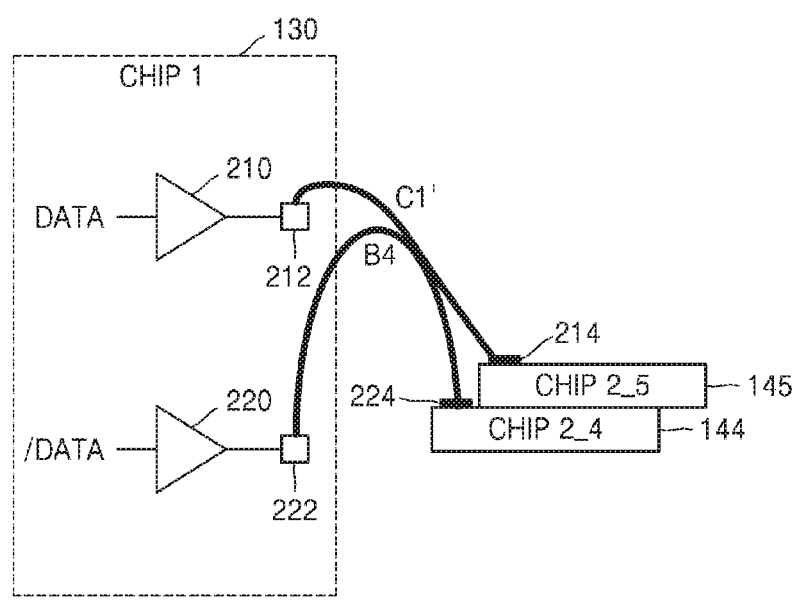
FIG. 2 is a diagram for describing a region in which bonding wires of FIG. 1 are short-circuited.

FIG. 2 is a diagram for describing a region in which bonding wires of FIG. 1 are short-circuited.

Referring to FIG. 2, the second bonding wire B4 and the third bonding wire C1' are short-circuited to each other. The third bonding wire C1' may be connected between a first bonding pad 212 of the first semiconductor chip 130 and a bonding pad 214 of the second semiconductor chip 145. Although FIG. 1 shows that the second bonding wire B4 is not directly connected to the first semiconductor chip 130, in a case that a signal transmitted through the second bonding wire B4 is a signal applied from the first semiconductor chip 130, it may be considered that the second bonding wire B4 is connected to the first semiconductor chip 130. Thus, the second bonding wire B4 may be illustrated as being connected between a second bonding pad 222 of the first semiconductor chip 130 and a bonding pad 224 of the second semiconductor chip 144.

The first semiconductor chip 130 may receive signals (e.g., commands, addresses, and/or data) from the second semiconductor chips 144 and 145, and output to the first and second bonding pads 212 and 222. Signals output from the first semiconductor chip 130 may be transmitted to the second semiconductor chips 144 and 145 through the second bonding wire B4 and the third bonding wire C1 connected to the first and second bonding pads 212 and 222, respectively, in the present example embodiment, it is assumed that signals transmitted by the first semiconductor chip 130 to the second semiconductor chips 144 and 145 through the second bonding wire 134 and the third bonding wire C1 are data DATA and /DATA.

In the first semiconductor chip 130, the first and second bonding pads 212 and 222 may be connected to the first and second output drivers 210 and 220 that drive first and second data DATA and /DATA, respectively.

The first data DATA output from the first output driver 210 may be transmitted to the second semiconductor chip 145 through the first bonding pad 212 and the third bonding wire C1'. The second data /DATA output from the second output driver 220 may be transmitted to the second semiconductor chip 144 through the second bonding pad 222 and the second bonding wire B4. In the present example embodiment, for convenience of explanation of testing short-circuit of bonding wires, it will be described below that the first data DATA and the second data /DATA are complementary to each other, meaning that the second data /DATA is an inversed signal of the first data DATA.

Figure 3:
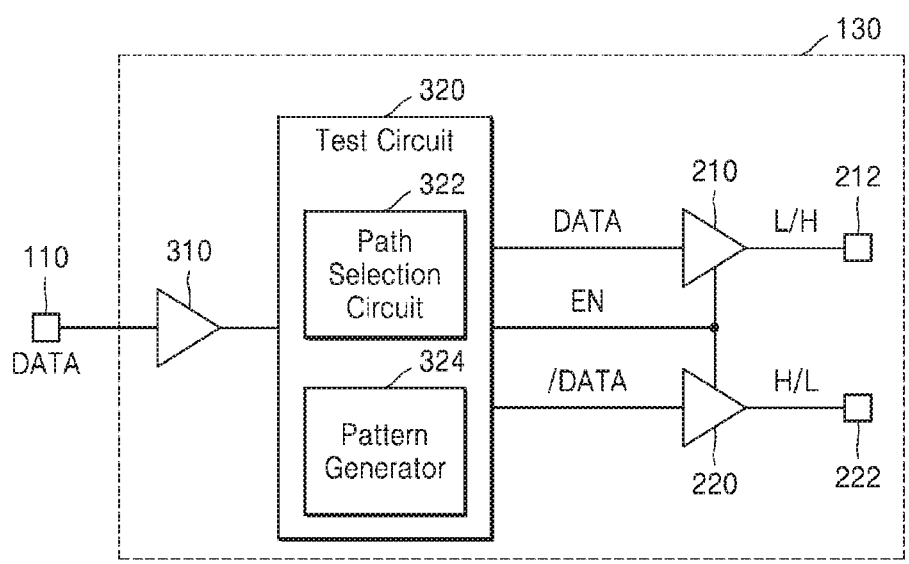
FIG. 3 is a circuit diagram showing a part of the first semiconductor chip including a test circuit in the multi-chip package of FIG. 1, according to an example embodiment of the inventive concepts.
Figure 4:
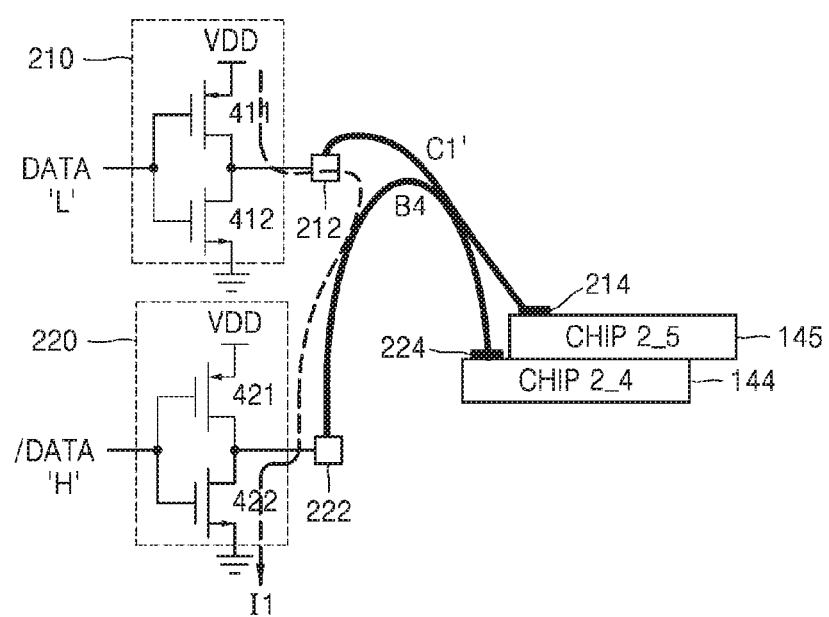
FIGS. 4 and 5 are diagrams for describing a method of testing whether internal bonding wires of a multi-chip package are short-circuited according to an example embodiment of the inventive concepts.
Figure 5:
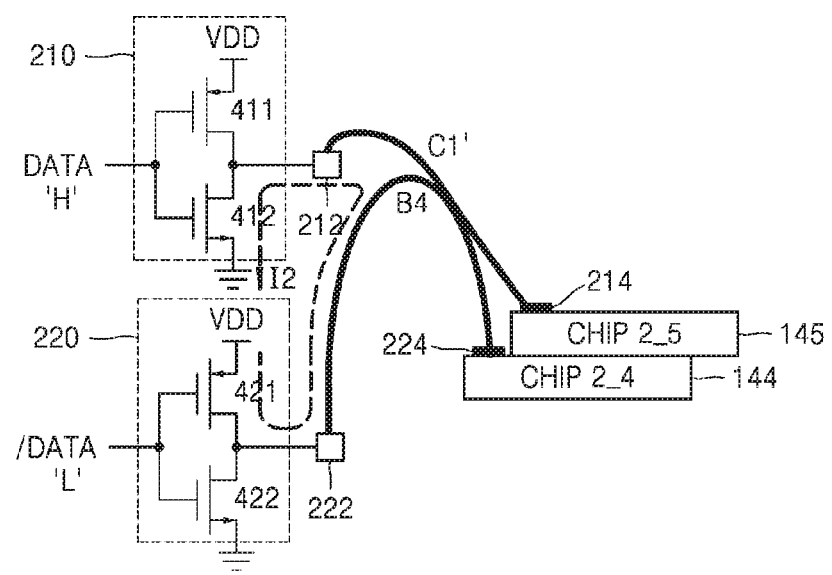

FIGS. 3 through 5 are diagrams for describing a method of testing whether internal bonding wires of a multi-chip package are short-circuited according to an example embodiment of the inventive concepts. FIG. 3 is a circuit diagram showing a part of the first semiconductor chip 130 including a test circuit 320 in the multi-chip package 100 of FIG. 1. FIGS. 4 and 5 are diagrams showing a method of testing short-circuited bonding wires.

Referring to FIGS. 2 and 3, the first semiconductor chip 130 includes an input driver 310, the test circuit 320, the first and second output drivers 210 and 220, and the first and second bonding pads 212 and 222. The first semiconductor chip 130 may further include control logics for controlling the second semiconductor chips 141 through 148 (FIG. 1).

The input driver 310 is connected to the external terminal 110 of the multi-chip package 100 (FIG. 1) through the TSV 122 of the printed circuit board 120 (FIG. 1). The external terminal 110 may be a data terminal from among a plurality of external terminals of the multi-chip package 100.

The input driver 310 may receive the data DATA applied to the data terminal (e.g., the external terminal 110), and provide the data DATA to the test circuit 320. The data DATA to the external terminal 110 may serve as a signal to activate the test circuit 320 (e.g., a test enable signal).

The test circuit 320 may enable output drivers of the first semiconductor chip 130 connected to the bonding pads contacting the bonding wires A1, B1 through B4, and C1 through C4 (FIG. 1). The test circuit 320 may transmit the complementary data DATA and /DATA to at least two bonding pads from among the bonding pads and may provide a current path to the output drivers connected to the at least two bonding pads. The test circuit 320 may determine that internal bonding wires (or alternatively, internal signal lines) are short-circuited to each other in the case that a current flowing between a power voltage and a ground voltage along a current path formed in the output driver increases.

According to an example embodiment, the test circuit 320 may enable the output driver and the input driver of the first semiconductor chip 130 connected to the first and second pads 212, 222 contacting the bonding wires A1, B1 through B4, and C1 through C4, respectively. The test circuit 320 may output first data to the first pad 212 through the output driver 210 and receive second data from the second pad 222 through the output driver 220. The test circuit 320 may detect short-circuit internal bonding wires (or alternatively, internal signal lines) by inverting one of the first and second data.

The test circuit 320 includes a path selection circuit 322 and a pattern generator 324 that operate in a test mode in response to the data DATA received through the input driver 310.

In the test mode, the path selection circuit 322 may select the first output driver 210 and the second output driver 220 to be enabled simultaneously. The path selection circuit 322 may generate an enable signal EN in response to an output of input driver 310 and provide the enable signal EN to first output driver 210 and second output driver 220. The first and second output drivers 210 and 220 may be enabled simultaneously in response to the enable signal EN.

The pattern generator 324 may generate the first data DATA and the second data /DATA in response to an output of the input driver 310. The first data DATA may have the same logic level as data DATA applied to the external terminal 110, whereas the second data /DATA may have a logic level opposite to the logic level of the data DATA.

For example, the first data DATA provided in the pattern generator 324 may have a logic low level 'L' and the second data /DATA may have a logic high level 'H'. In this case, as shown in FIG. 4, a PMOS transistor 411 of the first output driver 210 may be turned ON by the first data DATA having the logic low level 'L', whereas an NMOS transistor 422 of the second output driver 220 may be turned on by the second data /DATA having the logic high level 'H'.

In FIG. 4, a first current path I1 connecting a power voltage VDD, the PMOS transistor 411, the first pad 212, the short-circuited third bonding wire C1' and the second bonding wire B4, the second pad 222, the NMOS transistor 422, and ground voltage VSS may be formed.

Due to the first current path I1, a current flowing between the power voltage VDD and the ground voltage VSS may be increased in the multi-chip package 100 (FIG. 1). Based on the current flowing between the power voltage VDD and the ground voltage VSS, it may be determined that the internal bonding wires (or alternatively, internal signal lines) of the multi-chip package 100 are short-circuited to each other, and thus the multi-chip package 100 is defective.

According to the present example embodiment, short-circuit of the bonding wires (or alternatively, internal signal lines) of the multi-chip package 100 is tested by using the data terminal of the multi-chip package 100. Thus, the number of terminals of the multi-chip package 100 does not have to be increased. Accordingly, miniaturization and cost reduction of the multi-chip package 100 may be realized.

The first data DATA provided by the pattern generator 324 of FIG. 3 may have the logic high level 'H', whereas the second data /DATA may have the logic low level 'L'. In this case, as shown in FIG. 5, the NMOS transistor 412 of the first output driver 210 may be turned ON by the first data. DATA having the logic high level 'H', whereas the PMOS transistor 421 of the second output driver 220 may be turned ON by the second data /DATA having the logic low level 'L'.

In FIG. 5, a second current path I2 connecting the power voltage VDD, the PMOS transistor 421, the second pad 222, the short-circuited second bonding wire B4 and the third bonding wire C1', the first pad 212, and the NMOS transistor 412 may be formed.

Due to the second current path I 2, the current flowing between the power voltage VDD and the ground voltage VSS may be increased in the multi-chip package 100 (FIG. 1). Based on the current flowing between the power voltage VIM) and the ground voltage VSS, it may be determined that the internal bonding wires (or alternatively, internal signal lines) of the multi-chip package 100 are short-circuited to each other, and thus the multi-chip package 100 is defective.

Figure 6:
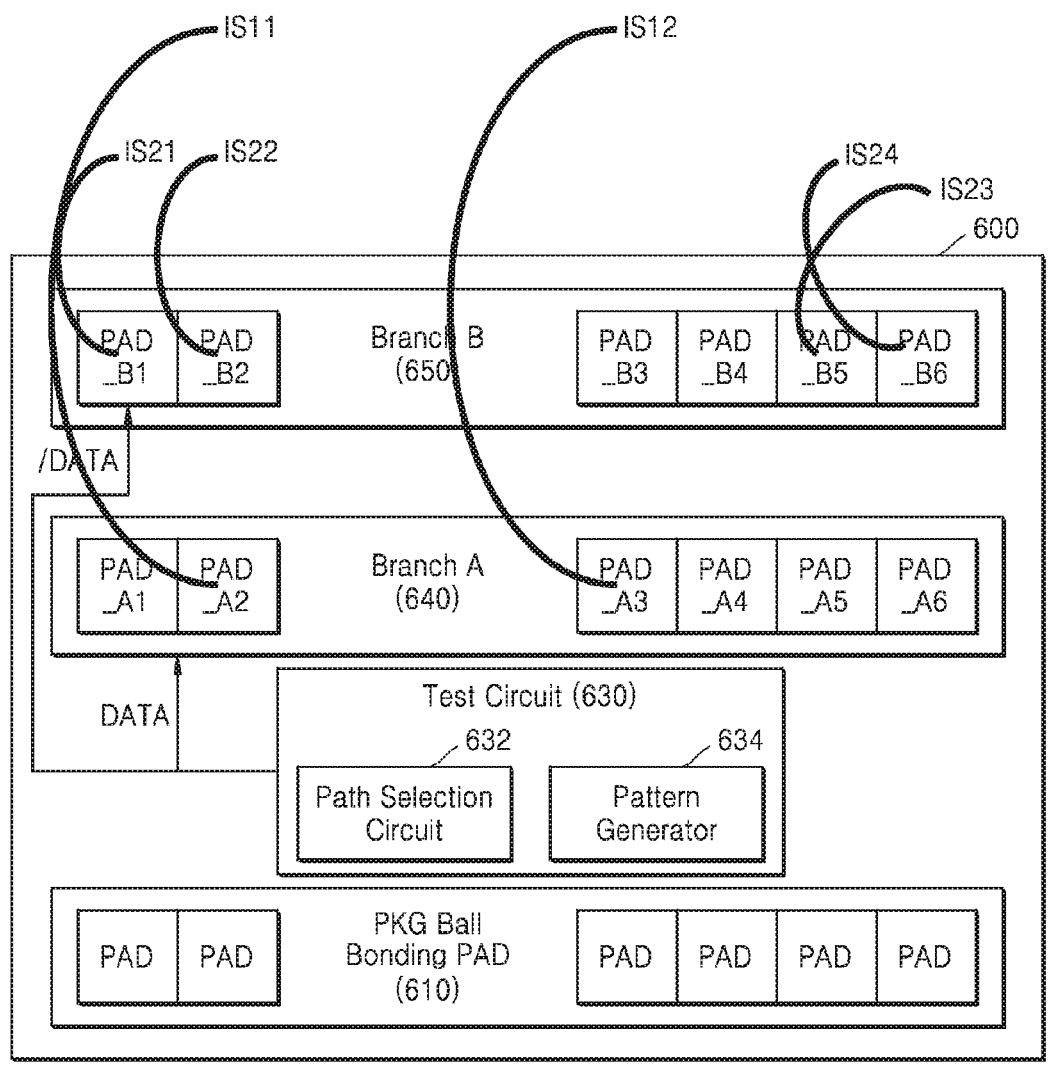
FIGS. 6 and 7 are diagrams for conceptually describing a method of testing whether internal bonding wires are short-circuited in a multi-chip package according to an example embodiment of the inventive concepts.
Figure 7:
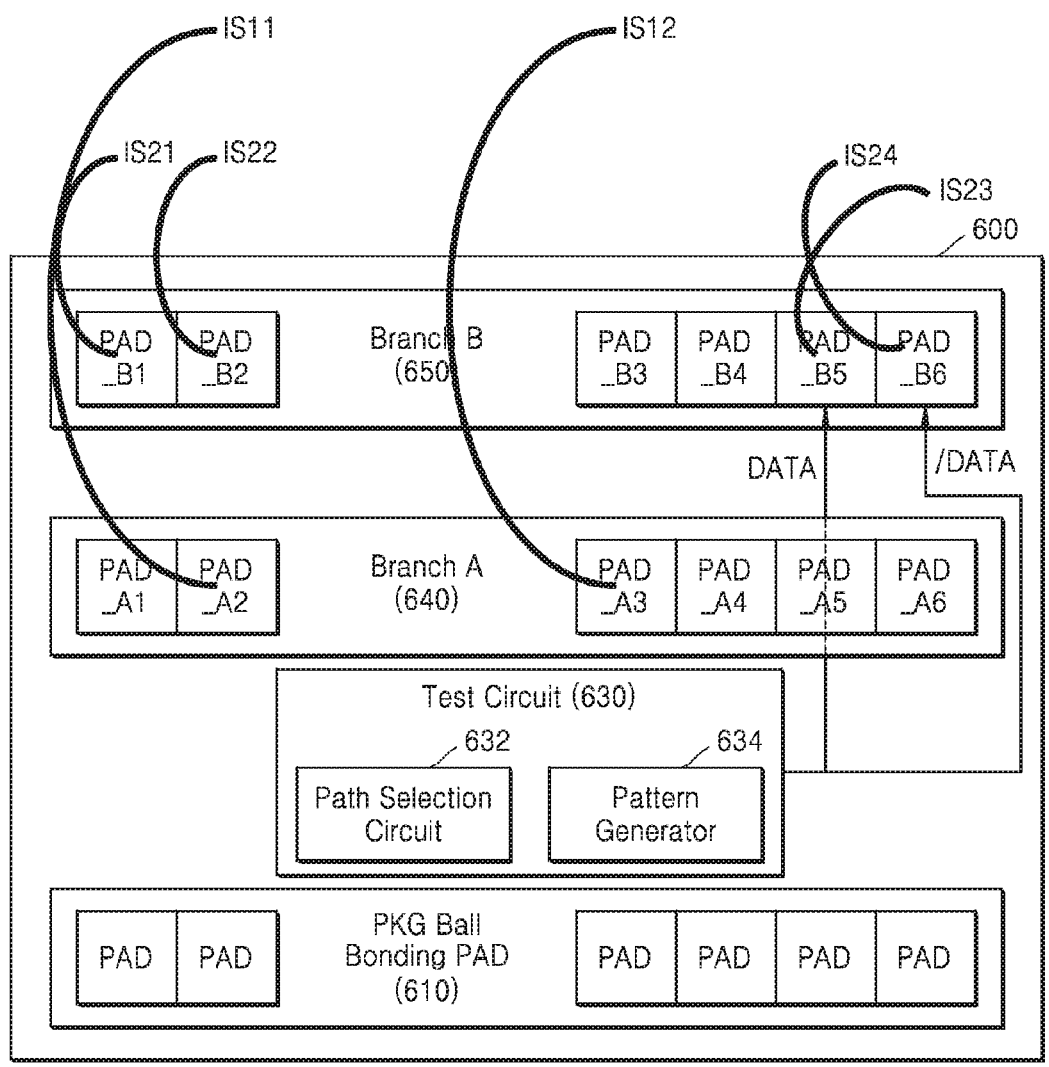

FIGS. 6 and 7 are diagrams for conceptually describing a method of testing whether internal bonding wires are short-circuited in a multi-chip package according to an example embodiment of the inventive concepts.

FIG. 6 shows a multi-chip package 600 in which bonding pads 640 and 650 contacting bonding wires IS11, IS12, IS21, IS22, IS23, and IS24 are contacted. The bonding wires IS11, IS12, IS21, IS22, IS23, and IS24 are internal bonding wires (or alternatively, internal signal lines) of the multi-chip package 600. The multi-chip package 600 includes first bonding pads 610, a test circuit 630, second bonding pads 640, and third bonding pads 650. The first bonding pads 610 may be connected to package balls or leads, whereas the second bonding pads 640 and the third bonding pads 650 may be connected to the test circuit 630.

The second bonding pads 640 are pads disposed in any one semiconductor chip of a plurality of semiconductor chips mounted in the multi-chip package 600 and may constitute a first branch (Branch A) contacting the first bonding wires IS11 and IS12. The second bonding pads 640 may be pads disposed in the first semiconductor chip 130 described above with reference to FIG. 1.

The third bonding pads 650 are bonding pads disposed on one semiconductor chip from among the remaining semiconductor chips mounted in the multi-chip package 600 may constitute a second branch (Branch B) contacting the second bonding wires IS21, IS22, IS23, and IS24. The third bonding pads 650 may be pads disposed in any one of the second semiconductor chips 141 through 148.

The test circuit 630 may test whether the bonding wires IS11 and IS12 contacting the second bonding pads 640 and IS21, IS22, IS23, and IS24 contacting the third bonding pads 650 are short-circuited. The test circuit 630 may include a path selection circuit 632 and a pattern generator 634.

The path selection circuit 632 may selectively activate circuits to which the first and second bonding pads 640 and 650 contacting the bonding wires IS11, IS12, IS21, IS22, IS23, and IS24 are connected. The pattern generator 634 may provide complementary data DATA and /DATA to the second bonding pads 640 and the third bonding pads 650.

In FIG. 6, the test circuit 630 may test whether bonding wires contacting different branches Branch A and Branch B are short-circuited. The test circuit 630 may test whether there is short-circuit between the first bonding wires IS11 and IS12 contacting the second bonding pads 640 of the first branch Branch A and the second bonding wires IS21, IS22, IS23, and IS24 contacting the third bonding pads 650 of the second branch Branch B.

The path selection circuit 632 may activate the output drivers 210 and 220 (FIG. 2) to which the second and third bonding pads 640 and 650 are connected. The pattern generator 634 may provide the first data DATA to the second bonding pads 640 and provide the second data /DATA to third bonding pads 650.

For example, the first bonding wire IS11 and the second bonding wire IS21 may be short-circuited. The output drivers 210 and 220 connected to a bonding pad PAD_A2 contacting the first bonding wire IS11 and a bonding pad PAD_B2 bonding pad contacting the second bonding wire IS21, respectively, may constitute the first current path I1 or the second current path I2 as described above with reference to FIGS. 4 and 5.

In the multi-chip package 600, a current flowing between the power voltage VDD and the ground voltage VSS may be increased due to the first current path I1 or the second current path I2. Therefore, the multi-chip package 600 may determine that the bonding wires contacting the different branches Branch A and Branch B, respectively, are short-circuited, and thus the corresponding multi-chip package 600 is defective.

In FIG. 7, the test circuit 630 may test whether bonding wires contacting bonding pads on a same branch (either Branch A or Branch B) is short-circuited. For example, the test circuit 630 tests whether the first bonding wires IS11 and IS12 contacting the second bonding pads 640 of the first branch Branch A are short-circuited to each other, or the second bonding wires IS21, IS22, IS23, and IS24 contacting the third bonding pads 650 of the second branch Branch B are short-circuited to one another.

For example, the second bonding wires IS23 and IS24 of the second branch Branch B may be short-circuited to each other. The path selection circuit 632 may activate the output drivers 210 and 220 connected to a bonding pad PAD_B5 and a bonding pad PAD_B6 from among the third bonding pads 650. The pattern generator 634 may provide the first data. DATA to the bonding pad. PAD_B5 and provide the second data /DATA to the bonding pad PAD_B6.

As described above with reference to FIGS. 4 and 5, the output drivers 210 and 220 connected to the bonding pad PAD_B5 and the bonding pad PAD_B6 from among the third bonding pads 650 may constitute the first current path I1 or the second current path I2. The current flowing between the power voltage VDD and the ground voltage VSS may be increased due to the first current path I1 or the second current path I2 in the multi-chip package 600. Therefore, the multi-chip package 600 may determine that the bonding wires contacting bonding pads a same branch (either Branch A or Branch B) are short-circuited to each other, and thus the corresponding multi-chip package 600 is defective.

Figure 8:
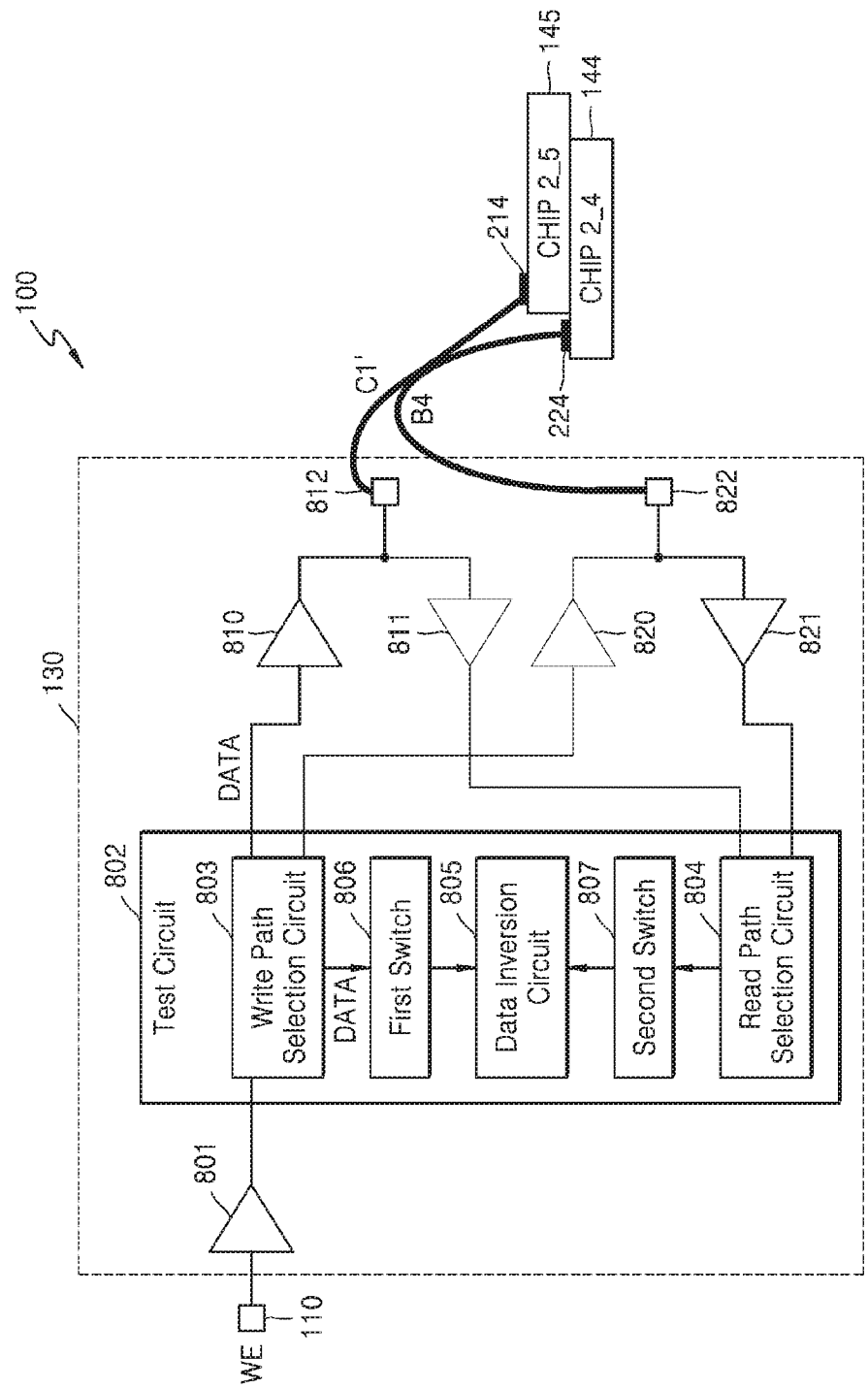
FIGS. 8 and 9 are diagrams for describing a method of testing whether internal bonding wires are short-circuited in a multi-chip package according to another example embodiment of the inventive concepts.
Figure 9:
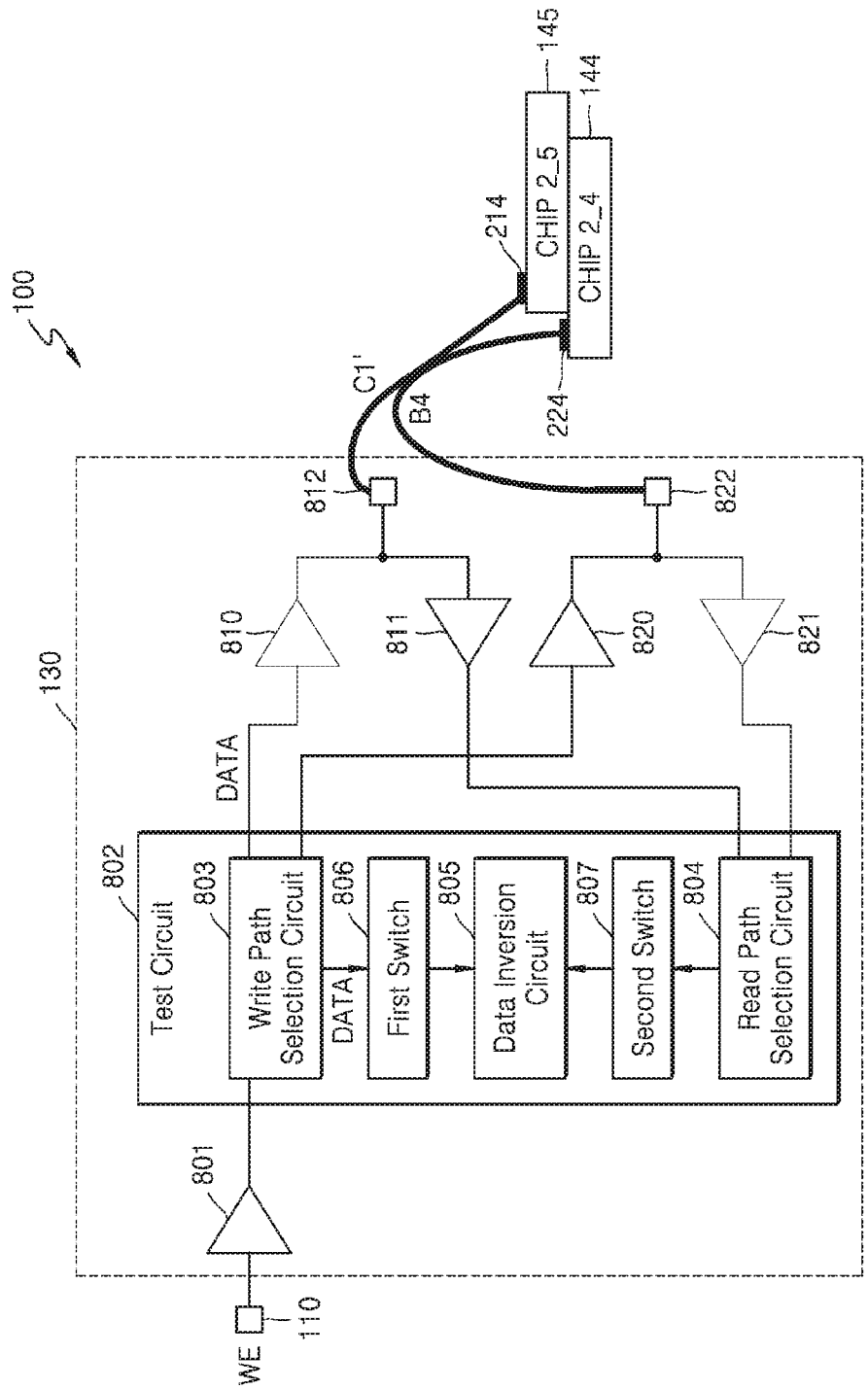

FIGS. 8 and 9 are diagrams for describing a method of testing whether internal bonding wires are short-circuited in a multi-chip package according to another example embodiment of the inventive concepts. FIGS. 8 and 9 are circuit diagrams of a part of the first semiconductor chip 130 including a test circuit 802 in the multi-chip package 100 of FIG. 1.

Referring to FIGS. 1 and 8, the first semiconductor chip 130 of the multi-chip package 100 includes an input driver 801, the test circuit 802, first and second output drivers 810 and 820, first and second input drivers 811 and 821, and first and second bonding pads 812 and 822. The first and second bonding pads 812 and 822 may be configured as bidirectional input/output pads. For example, the first bonding pad 812 may contact the third bonding wire C1' and the second bonding pad 822 may contact the second bonding wire B4.

The input driver 801 is connected to the external terminal 110 (FIG. 1) of the multi-chip package 100 through the TSV 122 (FIG. 1) of the printed circuit board 120 (FIG. 1). The external terminal 110 may be a terminal for receiving a write enable signal WE from among the plurality of external terminals of the multi-chip package 100.

The input driver 801 may receive a write enable signal WE applied through the external terminal 110 and provide the write enable signal WE to the test circuit 802. The write enable signal WE from the external terminal 110 may function as a signal to activate the test circuit 802 (e.g., a test enable signal).

The test circuit 802 receives the write enable signal WE through the input driver 801 and test whether the bonding wires 134 and C1' are short-circuited to each other by using a first output driver 810 and a second input driver 821. The test circuit 802 includes a write path selection circuit 803, a read path selection circuit 804, a data inversion circuit 805, and first and second switches 806 and 807, which operate in a test mode in response to the write enable signal WE.

The write path selection circuit 803 may select to enable the first output driver 810 in the test mode. The write path selection circuit 803 may transmit data DATA to the first output driver 810. The write path selection circuit 803 may also provide the data DATA to the data inversion circuit 805 through the first switch 806.

The read path selection circuit 804 may select to enable the second input driver 821 in the test mode. The read path selection circuit 804 may receive data output from the second input driver 821. The read path selection circuit 804 may provide the received data to the data inversion circuit 805 through the second switch 807.

In the test circuit 802, it is assumed that the data DATA transmitted from the write path selection circuit 803 to the first output driver 810 has the logic low level 'L'. The write path selection circuit 803 may transmit the data DATA having the logic low level 'L' to the data inversion circuit 805 through the first switch 806. The first bonding pad 812 may receive data DATA having the logic low level 'L' through the first output driver 810.

The first bonding pad 812 and the second bonding pad 822 may be connected to each other through the short-circuited second bonding wire B4 and the short-circuited third bonding wire C1' as shown in FIG. 1. The second bonding pad 822 may have data DATA having the logic low level 'L' identical to the data DATA of the first bonding pad 812. The data DATA having the logic low level 'L' of the second bonding pad 822 may be provided to the second input driver 821.

The read path selection circuit 804 may provide the data DATA having the logic low level 'L' received by the second input driver 821 to the data inversion circuit 805 through the second switch 807.

The data inversion circuit 805 may invert the data DATA having the logic low level 'L' provided from the write path selection circuit 803 and generate data /DATA having the logic high level 'H'. The data inversion circuit 805 may cause short-circuit between the data /DATA having the inverted logic high level 'H' and the data DATA having the logic low level 'L' provided from the read path selection circuit 804.

According to an example embodiment, the data inversion circuit 805 may invert the data DATA having the logic low level 'L' provided from the read path selection circuit 804 and generate data /DATA having the logic high level 'H'. The data inversion circuit 805 may cause short-circuit between the data /DATA having the inverted logic high level 'H' and the data DATA having the logic low level 'L' provided from the write path selection circuit 803.

Due to the short-circuit caused in the data inversion circuit 805, a current flowing between the power voltage VDD and the ground voltage VSS may be increased in the multi-chip package TOO. Therefore, the multi-chip package 100 may determine that bonding wires are short-circuited, and thus the corresponding multi-chip package 100 is defective.

Referring to FIG. 9, the test circuit 802 may test whether the bonding wires B4 and C1' are short-circuited by using the second output driver 820 and the first input driver 811. The write path selection circuit 803 may select to enable the second output driver 820 in the test mode. The write path selection circuit 803 may transmit data DATA to the second output driver 820 and may also transmit data DATA to the data inversion circuit 805 through the first switch 806.

In the test mode, the read path selection circuit 804 may select to enable the first input driver 811. The read path selection circuit 804 may provide the data received by the first input driver 811 to the data inversion circuit 805 through the second switch 807.

In the test circuit 802, it is assumed that the data DATA transmitted from the write path selection circuit 803 to the second output driver 820 has the logic high level 'H'. The write path selection circuit 803 may transmit the data DATA having the logic high level 'H' to the data inversion circuit 805 through the first switch 806. The second bonding pad 822 may receive the data DATA having the logic high level 'H' through the second output driver 820.

The first bonding pad 812 and the second bonding pad 822 may be connected to each other through the second bonding wire 134 and the third bonding wire C1' that are short-circuited to each other, as shown in FIG. 1. The first bonding pad 812 may have data DATA having the logic high level 'H' identical to the data DATA of the second bonding pad 822. The data DATA having the logic high level 'H' of the first bonding pad 812 may be provided to the first input driver 811.

The read path selection circuit 804 may provide the data DATA having the logic high level 'H' received by the first input driver 811 to the data inversion circuit 805 through the second switch 807.

The data inversion circuit 805 may invert the data DATA having the logic high level 'H' provided from the write path selection circuit 803 and generate the data /DATA having the logic low level 'L'. The data inversion circuit 805 may cause short-circuit between the data DATA having the inverted logic low level (L) and the data DATA having the logic high level (a) provided from the read path selection circuit 804.

According to an example embodiment, the data inversion circuit 805 may invert the data DATA having the logic high level 'H' provided from the read path selection circuit 801 and generate the data /DATA having the logic low level 'L'. The data inversion circuit 805 may cause short-circuit between the data /DATA having the inverted logic low level 'L' and the data DATA having the logic high level 'H' provided from the write path selection circuit 803.

Due to the short-circuit caused in the data inversion circuit 805, a current flowing between the power voltage VDD and the ground voltage VSS may be increased in the multi-chip package TOO. Therefore, the multi-chip package 100 may determine that bonding wires are short-circuited, and thus the corresponding multi-chip package 100 is defective.

Figure 10:
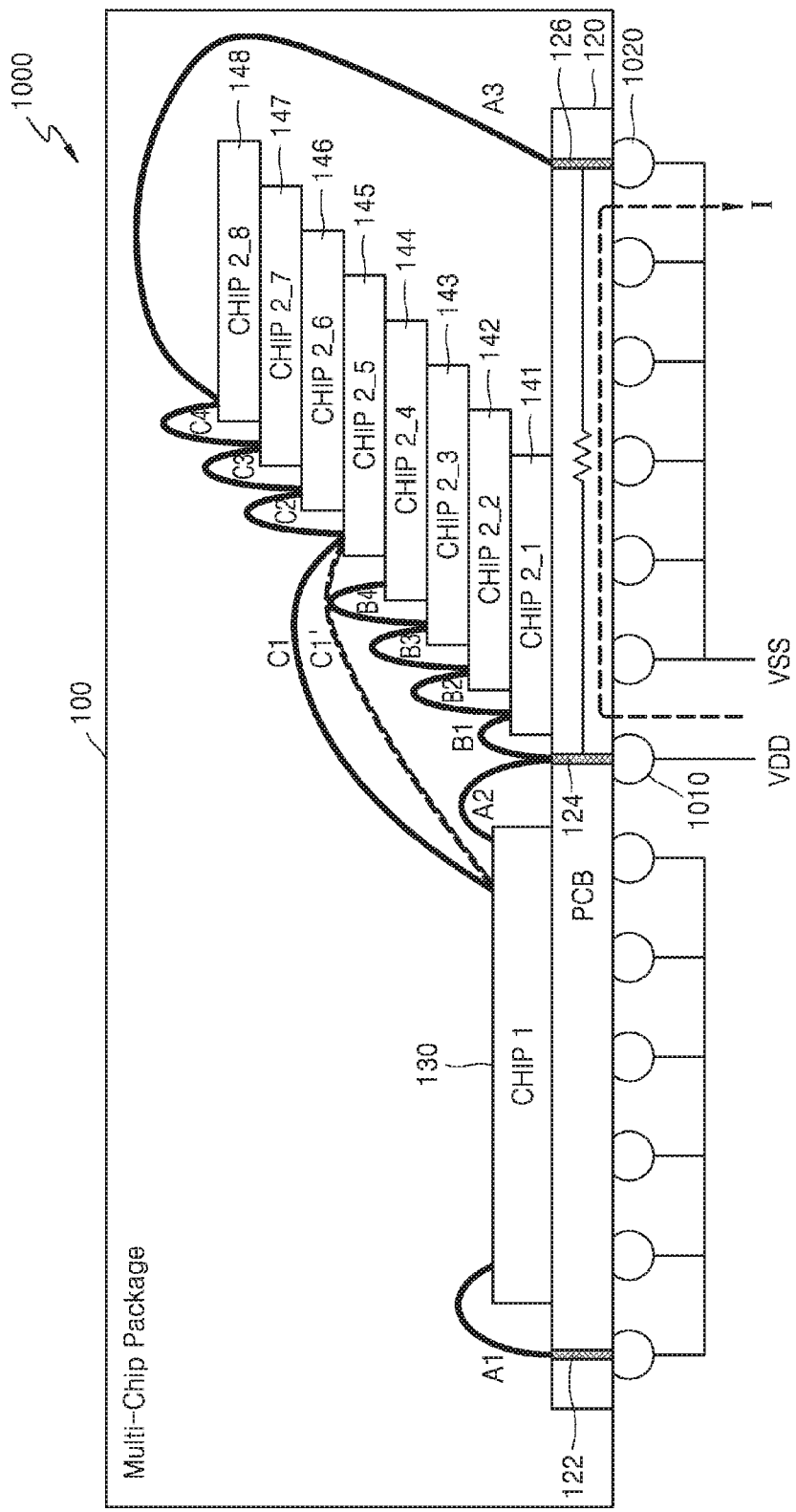
FIG. 10 is a diagram for describing a method of testing whether internal bonding wires are short-circuited in a multi-chip package according to another example embodiment of the inventive concepts.

FIG. 10 is a diagram for describing a method of testing whether internal bonding wires are short-circuited in a multi-chip package according to another example embodiment of the inventive concepts.

Referring to FIG. 10, a multi-chip package 1000 is identical to the multi-chip package 100 of FIG. 1 except that the multi-chip package 1000 further includes first bonding wires A2 and A3 respectively connected to external terminals 1010 and 1020 of the multi-chip package 1000. In order to avoid repetition of descriptions, detailed description of the other components, that is, the printed circuit board 120, the first semiconductor chip 130, the second semiconductor chips 141 through 148, the first bonding wire A1, the second bonding wires B1 through B4, and the third bonding wires C1 through C4 will be omitted.

The first bonding wire A2 electrically interconnects the first semiconductor chip 130 and the first external terminal 1010 of the multi-chip package 1000. The first bonding wire A2 may be connected between a pad of a TSV 124 of the printed circuit board 120 connected to the first external terminal 1010 and a pad of the first semiconductor chip 130.

The first bonding wire A3 electrically interconnects the second semiconductor chip 148 and the first external terminal 1020 of the multi-chip package 1000. The first bonding wire A3 may be connected between a pad of a TSV 126 of the printed circuit board 120 connected to the first external terminal 1020 and a pad of the second semiconductor chip 148.

In the test mode, the second external terminals 1020 other than the first external terminal 1010 from among the external terminals of the multi-chip package 1000 may be electrically connected to one another. The second external terminals 1020 may be electrically connected to one another outside the multi-chip package 1100.

In the multi-chip package 1000, the second bonding wire B4 may be short-circuited to the third bonding wire C1' (the third bonding wire C1 in a sagged state). In order to test whether the internal bonding wires B4 and C1' are short-circuited, the multi-chip package 1000 may apply the power voltage VDD to the first external terminal 1010 from among the external terminals of the multi-chip package 1000 and apply the ground voltage VSS to the second external terminals 1020.

In the multi-chip package 1000, a current path I formed between the power voltage VDD of the first external terminal 1010 and the second external terminals 1020 may be modelled by the second bonding wire B4 and the third bonding wire C1' short-circuited to each other. Due to the current path I, a current flowing between the power voltage VDD and the ground voltage VSS may be increased in the multi-chip package 1000. Based on this current, it may be determined that bonding wires (e.g., the internal signal lines) of the multi-chip package 1000 are short-circuited, and thus the corresponding multi-chip package 1000 is defective.

Figure 11:
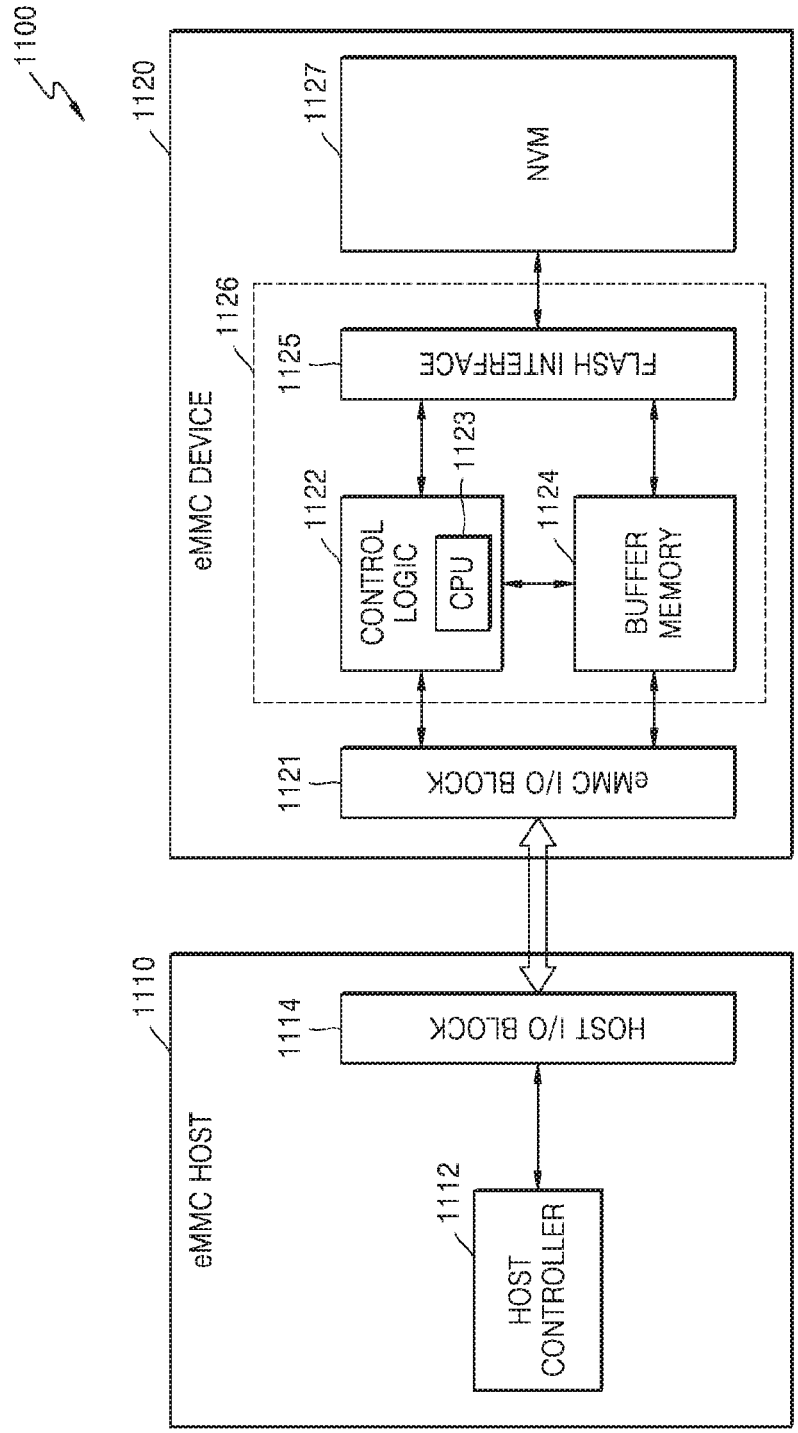
FIG. 11 is a block diagram illustrating an embedded multimedia card (eMMC) system including a multi-chip package according to example embodiments of the inventive concepts.

FIG. 11 is a block diagram illustrating an embedded multimedia card (eMMC) system including a multi-chip package according to an example embodiment of the inventive concepts.

Referring to FIG. 11, an eMMC system 1100 may include an eMMC host 1110 and an eMMC device 1120. The eMMC host 1110 and the eMMC device 1120 may be connected to each other through an eMMC interface.

The eMMC host 1110 may refer to a microprocessor or an application processor, and the microprocessor or the application processor may be embedded or implemented in an electronic device. The electronic device may be a personal computer (PC), a laptop computer; a mobile phone, a smart phone, a tablet PC, a personal digital assistant (PDA), an enterprise digital assistant (EDA), a digital camera, a portable multimedia player (PMP), a portable navigation device (PND), a MP3 player, an e-book device, etc.

The eMMC host 1110 may control data processing operations (e.g., a data read operation and a data write operation) of the eMMC device 1120. The eMMC host 1110 may include a host controller 1112 and a host input/output block 1114. During a data read operation, the host controller 1112 may receive data read from a non-volatile memory device 1127 of the eMMC device 1120 through the host input/output block 1114. During a data write operation, the host controller 1112 may transmit data to be written to the non-volatile memory device 1127 of the eMMC device 1120 to the host input/output block 1114.

The eMMC host 1110 may generate a clock signal to be used in the eMMC host 1110 and the eMMC device 1120, and may provide the generated clock signal to the eMMC device 1120. The eMMC host 1110 may also generate input and output operation voltages to be used by the host controller 1112 and provide the input and output operation voltages to the host controller 1112 and may generate core operating voltages to be used by the non-volatile memory device 1127 of the eMMC device 1120 and provide the core operating voltages to the eMMC device 1120.

The eMMC device 1120 may include an eMMC input/output block 1121, a control logic block 1122, a buffer memory 1124, a memory interface 1125, and a multi-chip package including the non-volatile memory device 1127. The control logic block 1122 including a CPU 1123, the buffer memory 1124, and the memory interface 1125 may function as an eMMC controller 1126 for controlling data communication between the eMMC host 1110 and the non-volatile memory device 1127.

During a data write operation, data received through the eMMC input/output block 1121 under the control of the CPU 1123 may be temporarily stored in the buffer memory 1124. The memory interface 1125 may read the data stored in the buffer memory 1124 and write the read data to the non-volatile memory device 1127 under the control of the CPU 1123.

During the data read operation, the memory interface 1125 may store data output from the non-volatile memory device 1127 in the buffer memory 1124 under the control of the CPU 1123. Under the control of the CPU 1123, the data stored in the buffer memory 1124 may be transmitted to the host input/output block 1114 through the eMMC input/output block 1121.

The eMMC device 1120 of the eMMC system 1100 may be implemented as a multi-chip package as described above with reference to FIGS. 1 through 10. The eMMC input/output block 1121 and the eMMC controller 1126 of the eMMC device 1120 may correspond to the first semiconductor chip 130 of the multi-chip package 100 (FIG. 1), and the non-volatile memory device 1127 may correspond to second semiconductor chips 141 through 148. According to some example embodiments, the buffer memory 1124 in the eMMC controller 1126 may be implemented as any one of the second semiconductor chips 141 through 148 instead of being embedded in the first semiconductor chip 130, which corresponds to the eMMC controller 1126.

The multi-chip package of the eMMC device 1120 includes the eMMC controller 1126, which is mounted on a printed circuit board and includes a test circuit, and the non-volatile memory device 1127, which is mounted on the printed circuit board and is connected to the eMMC controller 1126 through a plurality of internal bonding wires (or alternatively, a plurality of internal signal line)s. The test circuit enables output drivers of the eMMC controller 1126 connected to bonding pads contacting internal bonding wires of the multi-chip package, transmits complementary data to at least two bonding pads from among the bonding pads, and forms current paths in output drivers connected to the at least two bonding pads, thereby detecting short-circuit of the internal bonding wires.

According to an example embodiment, the test circuit enables the output driver and input driver of the eMMC controller 1126 respectively connected to first and second pads contacting the internal bonding wires of the multi-chip package, outputs first data to the first pad through the output driver, receives second data from the second pad through the input driver, and invert one of the first and second data, thereby detecting short-circuit of the internal bonding wires (or alternatively, internal signal lines).

Figure 12:
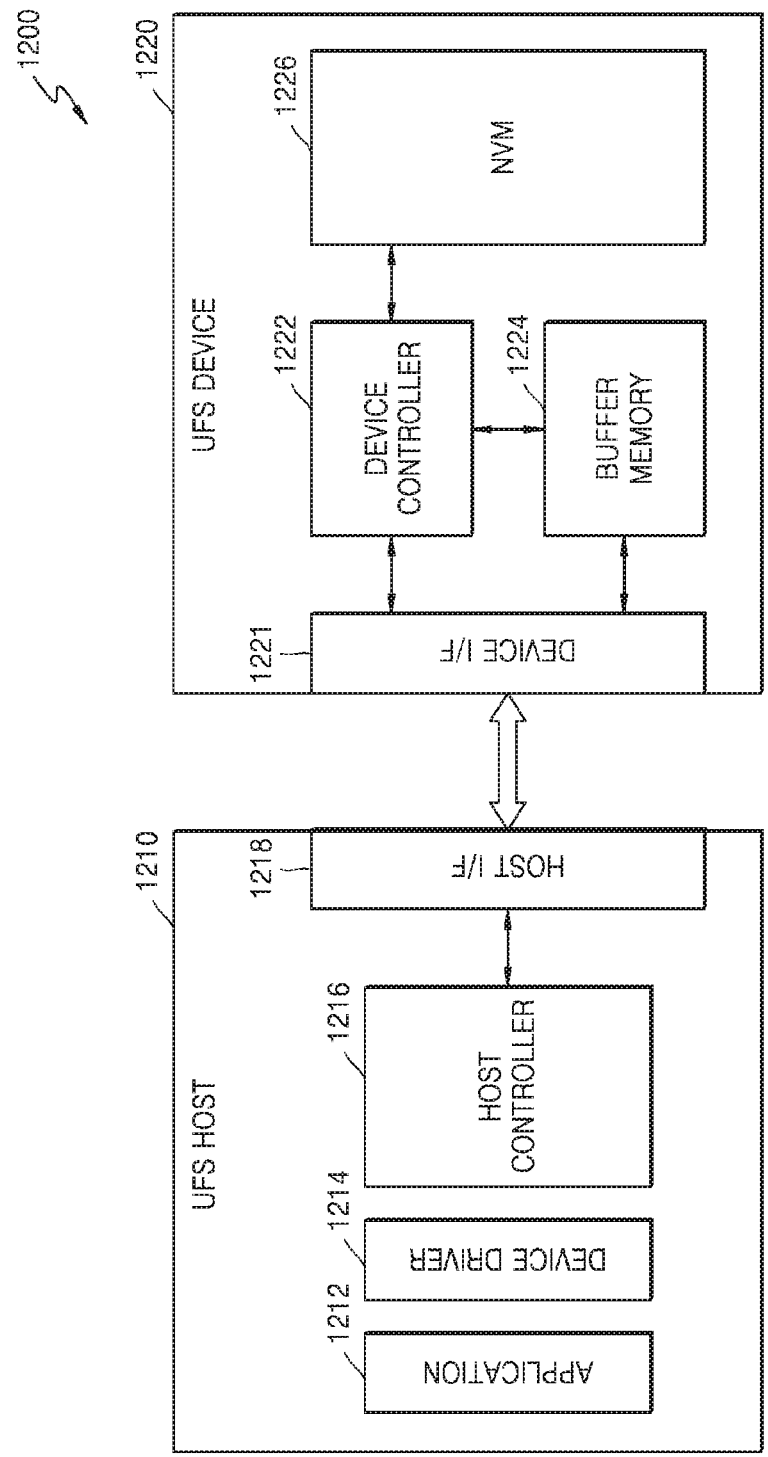
FIG. 12 is a diagram illustrating a universal flash storage (UFS) system including a multi-chip package according to an example embodiment of the inventive concepts.

FIG. 12 is a diagram illustrating a universal flash storage (UFS) system including a multi-chip package according to an example embodiment of the inventive concepts.

Referring to FIG. 12, a UFS system 1200 includes a UFS host 1210 and a UFS device 1220. The UFS host 1210 and the UFS device 1220 may be connected to each other through a UFS interface. The UFS system 1200 is based on a non-volatile memory device (e.g., flash memory), and may be used in mobile devices (e.g., smart phones).

The UFS host 1210 may include an application 1212, a device driver 1214, a host controller 1216, and a host interface 1218. The application 1212 may include a variety of application programs executed on the UFS host 1210. The device driver 1214 may be peripheral devices connected to and used by the UFS host 1210, and may drive the UFS device 1220. The application 1212 and the device driver 1214 may be implemented in the form of software or firmware.

The host controller 1216 may generate a protocol or command to be provided to the UFS device 1220 according to a request from the application 1212 and the device driver 1214, and transmit the generated command to the UFS device 1220 through the host interface 1218. When a write request is received from the device driver 1214, the host controller 1216 may provide a write command and data to the UFS device 1220 through the host interface 1218. When a read request is received from the device driver 1214, the host controller 1216 may provide a read command to the UFS device 1220 via the host interface 1218 and receives data from the UFS device 1220.

The UFS device 1220 may be connected to the UFS host 1210 through a device interface 1221. The host interface 1218 and the device interface 1221 may be connected to each other through a data line for exchanging data or signals and a power line for supplying power.

The UFS device 1220 may include a device controller 1222, a buffer memory 1224, and a non-volatile memory device 1226. The device controller 1222 may control entire operations e.g., writing, reading, and/or erasing) of the non-volatile memory device 1226. The device controller 1222 may exchange data with the buffer memory 1224 or the non-volatile memory device 1226 through a bus. The device controller 1222 may include a central processing unit (CPU), a direct memory access (DMA), a flash DMA, a command manager, a buffer manager, a flash translation layer (FTL), a flash manager, etc.

The UFS device 1220 may provide a command received from the UFS host 1210 to the device DMA and command manager through the device interface 1221. The command manager may allocate the buffer memory 1224 for receiving data through the buffer manager and transmit a response signal to the UFS host 1210 when preparation for data transmission is completed.

The UFS host 1210 may transmit data to the UFS device 1220 in response to a response signal. The UFS device 1220 may store the transmitted data in the buffer memory 1224 through the device DMA and the buffer manager. The data stored in the buffer memory 1224 may be provided to the flash manager through the flash DMA and the flash manager may store the data at a selected address of the non-volatile memory device 1226 with reference to address mapping information regarding the FTL When data transmission and programming for carrying out a command of the UFS host 1210 are completed, the UFS device 1220 may transmit an acknowledgement signal to the UFS host 1210 through the device interface 1221 and inform the UFS host 1210 whether the corresponding command is carried out. The UFS host 1210 may notify the device driver 1214 and the application 1212 whether the command corresponding to the acknowledgement signal is carried out and may terminate the command.

The UFS device 1220 of the UFS system 1200 may be implemented as one of multi-chip packages as shown in FIGS. 1 through 10. The device controller 1222 of the UFS device 1220 may correspond to the first semiconductor chip 130 of the multi-chip package 100 (FIG. 1), and the buffer memory 1224 and the non-volatile memory device 1226 may correspond to the second semiconductor chips 141 through 148.

The multi-chip package of the UFS device 1220 may include the device controller 1222. The device controller 1222 may be mounted on a printed circuit board and include a test circuit, the buffer memory 1224 and the non-volatile memory device 1226. The test circuit, the buffer memory 1224, and the non-volatile memory device may be electrically connected to the device controller 1222 via a plurality of signal lines. The test circuit may enable output drivers of the device controller 1222 connected to bonding pads of the multi-chip package contacting internal bonding wires of the multi-chip package, transmit complementary data to at least two bonding pads from among the bonding pads, and form a current path in output drivers connected to the at least two bonding pads, thereby detecting short-circuit of the internal bonding wires.

According to an example embodiment, the test circuit may enable the output driver and input driver of the device controller 1222 respectively connected to first and second pads, which are in contact with the internal bonding wires of the multi-chip package, output first data to the first pad through the output driver, receive second data from the second pad through the input driver, and invert one of the first and second data, thereby detecting short-circuit of the internal bonding wires (or alternatively, internal signal lines).

Figure 13:
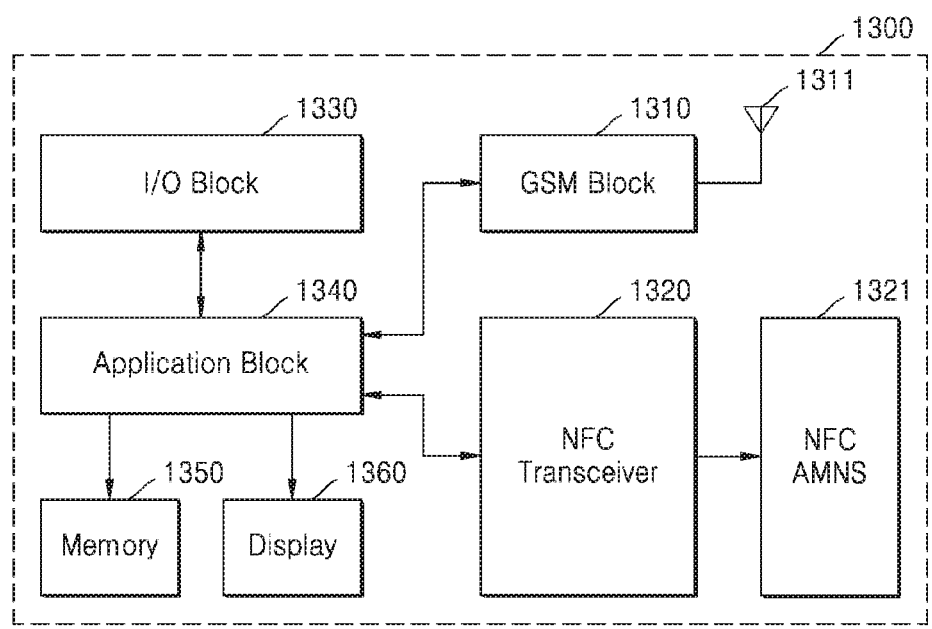
FIG. 13 is a block diagram showing an example of application of a memory device of a multi-chip package according to an example embodiment of the inventive concepts to a mobile device.

FIG. 13 is a block diagram showing an example of application of a memory device of a multi-chip package according to an example embodiment of the inventive concepts to a mobile device. The mobile device may be, for example, a mobile phone or a smart phone.

Referring to FIG. 13, a mobile device 1300 includes a global system for mobile communication (GSM) block 1310, a near field communication (NFC) transceiver 1320, an input/output block 1330, an application block 1340, a memory 1350, and a display 1360. The components/blocks of the mobile device 1300 shown in FIG. 13 are merely examples. The mobile device 1300 may include more or fewer components/blocks. Furthermore, although the mobile device 1300 employs the GSM technology according to the present example embodiment, the mobile device 1300 may be implemented by using other technologies, such as code division multiple access (CDMA). The blocks of FIG. 13 will be implemented in the form of an integrated circuit. In some example embodiments; some of the blocks may be implemented in the form of an integrated circuit, and the other blocks may be implemented in a separate form.

The GSM block 1310 may be connected to an antenna 1311 and may provide a wireless telephone operation in a known manner. The GSM block 1310 may include a receiver and a transmitter and may perform receiving and transmitting operations in correspondence thereto.

The NFC transceiver 1320 may be configured to transmit and receive NFC signals through inductive coupling for wireless communication. The NFC transceiver 1320 provides NFC signals to an NFC antenna matching network system 1321. The NFC antenna matching network system 1321 may transmit the NFC signals through inductive coupling. The NEC antenna matching network system 1321 may receive NFC signals provided from another NFC device and provide the received NFC signals to the NFC transceiver 1320.

The transmission and reception of NFC signals by the NFC transceiver 1320 may be performed in a time division manner. Therefore, a time period for the NFC transceiver 1320 to transmit NFC signals may be referred to as a "transmission period," and a corresponding operation mode of the NFC transceiver 1320 may be referred to as a "transmission mode" or an "NFC reader transmission mode". Similarly, the time period for the NFC transceiver 1320 to receive NFC signals may be referred to as a "reception period interval", and a corresponding operational mode of the NFC transceiver 1320 may be referred to as a "reception mode" or an "NFC tag reception mode".

The NFC transceiver 1320 may operate in compliance with regulations that are described in NFC Interface and Protocol-1 (NFCIP-1) and NFC Interface and Protocol-2 (NFCIP-2) and are standardized in ECMA-340, ISO/IEC 18092, ETSI TS 102 190, ISO 21481, ECMA 352, ETSI TS 102 312, etc.

The application block 1340 may include hardware circuits (e.g., one or more processors), and may be operated to provide various user applications provided by the mobile device 1300. User applications may include voice call operations, data transmission, data swapping, etc. The application block 1340 may operate in conjunction with the GSM block 1310 and/or the NFC transceiver 1320 and provide operation characteristics of the GSM block 1310 and/or the NFC transceiver 1320. In some example embodiments, the application block 1340 may include a program for mobile point-of-sale (POS). Such program may provide functions for credit card purchases and/or payments by using a mobile phone (e.g., a smart phone).

The display 1360 may display an image in response to display signals received from application block 1340. The image may be provided by application block 1340 or may be generated by a camera embedded in mobile device 1300. The display 1360 includes an internal frame buffer for temporarily storing pixel values and may be configured as a liquid crystal display screen with related control circuits.

The input/output block 1330 may provide an input function to a user and provide outputs to be received through the application block 1340.

The memory 1350 may store programs (or commands) and/or data to be used by the application block 1340 and may be implemented as a RAM, a ROM, a flash memory, etc. Therefore, the memory 1350 may include not only volatile memory elements, but also non-volatile storage elements. For example, the memory 1350 may be implemented as one of the multi-chip package as shown in FIGS. 1 through 10.

The memory 1350 of the multi-chip package may include a first semiconductor chip, which is a memory controller mounted on a printed circuit board and including a test circuit, and second semiconductor chips, which are memory devices mounted on the printed circuit board and are electrically connected to the first semiconductor chip via a plurality of internal bonding wires (or alternatively, a plurality of internal signal lines). The test circuit may enable output drivers of the first semiconductor chip connected to bonding pads contacting the internal bonding wires of the multi-chip package, transmit complementary data to at least two bonding pads from among the bonding pads, and form a current path in output drivers connected to the at least two bonding pads, thereby detecting short-circuit of the internal bonding wires.

According to an example embodiment, the test circuit may enable the output driver and input driver of the first semiconductor chip, the output driver and input driver respectively connected to first and second pads contacting respective internal bonding wires of the multi-chip package, output first data to the first pad through the output driver, receive second data from the second pad through the input driver, and invert one of the first and second data, thereby detecting short-circuit of the internal bonding wires (or alternatively, internal signal lines).

While the inventive concepts have been particularly shown and described with reference to some example embodiments thereof, it will be understood that various changes in form and details may be made therein without departing from the spirit and scope of the following claims.

What is claimed is:

1. A multi-chip package comprising:
a printed circuit board;
a first semiconductor chip on the printed circuit board, the first semiconductor chip including a test circuit and a plurality of pads; and
second semiconductor chips on the printed circuit board, the second semiconductor chips electrically connected to the first semiconductor chip via a plurality of internal signal lines, each of the internal signal lines being a bonding wire,
wherein the test circuit is configured to detect short-circuit between at least two of the plurality of internal signal lines that are respectively connected to at least two pads of the plurality of pads by (1) enabling circuits of the first semiconductor chip respectively connected to the plurality of pads contacting the plurality of internal signal lines, and (2) transmitting complementary data to the at least two pads.

2. The multi-chip package of claim 1, wherein the plurality of pads contacting the plurality of internal signal lines comprise bonding pads.

3. The multi-chip package of claim 1, wherein the circuits connected to the at least two pads comprise output drivers configured to transmit data to the second semiconductor chips via the plurality of internal signal lines.

4. The multi-chip package of claim 3, wherein the test circuit comprises:
a path selection circuit configured to enable the output drivers; and
a pattern generator configured to provide complementary data to the output drivers, respectively.

5. The multi-chip package of claim 1, wherein the test circuit is configured to be activated in response to data applied to a data terminal from among external terminals of the multi-chip package.

6. The multi-chip package of claim 1, wherein the test circuit is configured to detect the short-circuit between the plurality of internal signal lines of a first branch contacting the plurality of pads of the first semiconductor chip.

7. The multi-chip package of claim 6, wherein the test circuit is configured to detect the short-circuit between the plurality of internal signal lines of a second branch contacting the plurality of pads of the second semiconductor chips.

8. The multi-chip package of claim 1, wherein
the multi-chip package comprises an embedded multimedia card (eMMC) device,
the second semiconductor chips comprise non-volatile memory devices, and
the first semiconductor chip comprises an eMMC controller configured to perform data communication between the second semiconductor chips and an eMMC host outside the multi-chip package.

9. The multi-chip package of claim 1, wherein
the multi-chip package comprises a universal flash storage (UFS) device,
the second semiconductor chips comprise non-volatile memory devices, and
the first semiconductor chip comprises a device controller configured to control a write, read, or erase operation of the second semiconductor chips.

10. A multi-chip package comprising:
a printed circuit board;
a first semiconductor chip on the printed circuit board, the first semiconductor chip including a test circuit, a first pad, and a second pad; and
second semiconductor chips on the printed circuit board, the second semiconductor chips electrically connected to the first semiconductor chip via a plurality of internal signal lines, each of the plurality of internal signal lines being a bonding wire,
wherein the test circuit is configured to detect short-circuit between at least two of the plurality of internal signal lines that are respectively connected to the first pad and the second pad by inverting one of a first data and a second data by (1) enabling first and second circuits of the first semiconductor chip that are connected to the first pad and the second pad thereof, respectively, each of which is connected to a corresponding one of the plurality of internal signal lines of the multi-chip package, (2) outputting the first data to the first pad through the first circuit, and (3) receiving the second data from the second pad through the second circuit.

11. The multi-chip package of claim 10, wherein
the first circuit comprises an output driver connected to the first pad, and
the second circuit comprises an input driver connected to the second pad.

12. The multi-chip package of claim 11, wherein the test circuit comprises:
a write path selection circuit configured to provide the first data to the output driver;
a read path selection circuit configured to receive the second data from the input driver;
a first switch configured to provide the first data of the write path selection circuit to a data inversion circuit;
a second switch configured to provide the second data of the read path selection circuit to the data inversion circuit; and
the data inversion circuit configured to invert one of the first and second data.

13. The multi-chip package of claim 12, wherein the test circuit is configured to be activated in response to data applied to a data terminal from among external terminals of the multi-chip package.

14. The multi-chip package of claim 10, wherein
the multi-chip package comprises an embedded multimedia card (eMMC) device,
the second semiconductor chips comprise non-volatile memory devices, and
the first semiconductor chip comprises an eMMC controller configured to perform data communication between the second semiconductor chips and an eMMC outside the multi-chip package.

15. The multi-chip package of claim 10, wherein
the multi-chip package comprises a universal flash storage (UFS) device,
the second semiconductor chips comprise non-volatile memory devices, and
the first semiconductor chip comprises a device controller configured to control a write, read, or erase operation of the second semiconductor chips.

16. A multi-chip package comprising:
a printed circuit board;
a first semiconductor chip on the printed circuit board, the first semiconductor chip including a test circuit, a plurality of pads including a first pad and a second pad, an input driver, and an output driver, the test circuit including, a write path selection circuit configured to provide first data to the first pad, from among the plurality of pads, via the output driver, a read path selection circuit configured to receive second data from the second pad, from among the plurality of pads, via the input driver, a data inversion circuit configured to invert one of the first data and the second data, a first switch configured to provide the first data of the write path selection circuit to the data inversion circuit, and a second switch configured to provide the second data of the read path selection circuit to the data inversion circuit; and second semiconductor chips on the printed circuit board, the second semiconductor chips electrically connected to the first pad and the second pad of the first semiconductor chip via a plurality of internal signal lines, each of the plurality of internal signal lines being a bonding wire, wherein the test circuit is configured to detect short-circuit between at least two of the plurality of internal signal lines that are respectively connected to the first pad and the second pad by (1) enabling circuits of the first semiconductor chip respectively connected to the first pad and the second pad, and (2) transmitting complementary data to the first pad and the second pad.

17. The multi-chip package of claim 16, wherein the first and second pads comprise bonding pads.

18. The multi-chip package of claim 16, wherein the test circuit is configured to be activated in response to data applied to a data terminal from among external terminals of the multi-chip package.

19. The multi-chip package of claim 16, wherein the test circuit is configured to detect the short-circuit between the plurality of internal signal lines of a first branch contacting the first pad and the second pad of the first semiconductor chip.

20. The multi-chip package of claim 16, wherein the test circuit is configured to detect the short-circuit of the plurality of internal signal lines of a second branch contacting the first pad and the second pad of the second semiconductor chips.

* * * * *